United States Patent
Hwang et al.

[11] Patent Number: 5,687,195
[45] Date of Patent: Nov. 11, 1997

[54] DIGITAL AUTOMATIC GAIN CONTROLLER FOR SATELLITE TRANSPONDER

[75] Inventors: Yun Son Hwang; Nam Tae Kim; Seung Kee Mo; Kwang Rang Park, all of Seoul, Rep. of Korea

[73] Assignees: Electronics and Telecommunications Research Institute, Daejeon; Korea Telecommunication Authority, Seoul, both of Rep. of Korea

[21] Appl. No.: 457,504

[22] Filed: Jun. 1, 1995

[30] Foreign Application Priority Data

Dec. 16, 1994 [KR] Rep. of Korea ............... 94-34754

[51] Int. Cl.⁶ .................................................. H04L 27/08
[52] U.S. Cl. .......................... 375/345; 455/234.2; 342/92
[58] Field of Search .................................. 375/344, 345; 455/13.4, 13.6, 234.1, 234.2, 249.1, 250.1, 252.1; 342/92

[56] References Cited

U.S. PATENT DOCUMENTS

| | | | |
|---|---|---|---|
| 3,848,191 | 11/1974 | Anderson | 375/345 |
| 4,442,458 | 4/1984 | Barter | |
| 4,625,240 | 11/1986 | Yablonski et al. | 375/345 X |
| 4,829,593 | 5/1989 | Hara | 375/345 X |
| 5,054,116 | 10/1991 | Davidson | 455/126 |
| 5,179,353 | 1/1993 | Miyake | 375/345 X |
| 5,410,745 | 4/1995 | Friesen et al. | 455/333 |
| 5,493,712 | 2/1996 | Ramesh | 375/345 X |

OTHER PUBLICATIONS

"Simple Technique Yields Errorless Age Systems" Aug. 1989.
"Design Automatic Gain Control Loops the Easy Way".

*Primary Examiner*—Young T. Tse
*Attorney, Agent, or Firm*—Jacobson, Price, Holman & Stern, PLLC

[57] ABSTRACT

A digital automatic gain controller for a satellite transponder, comprising an amplification circuit for amplifying a radio frequency signal detected by a detector diode by a difference between the detected radio frequency signal and a temperature compensation signal, a microprocessor for inputting an output signal from the amplification circuit and outputting the inputted signal as a telemetry signal to the earth control station, the microprocessor adjusting an output level of a radio frequency channel in response to a telecommand signal from the earth control station based on the telemetry signal, and a conversion circuit for converting an output data signal from the microprocessor into a drive current for driving a PIN diode attenuator. According to the present invention, the digital automatic gain controller is capable of performing an automatic gain control operation flexibly and reliably on the basis of a program.

6 Claims, 2 Drawing Sheets

DIGITAL AUTOMATIC GAIN CONTROLLER FOR SATELLITE TRANSPONDER

BACKGROUND OF THE INVENTION

1. Field of the Invention

The present invention relates in general to automatic gain controllers for satellite transponder, and more particularly to a digital automatic gain controller for a satellite transponder which performs an automatic gain control function using a space-qualified microprocessor.

2. Description of the Prior Art

Generally, a satellite transponder is boarded on most of communications satellites operating on a geostationary orbit. The satellite transponder is a communications system having a simple transponder function. In other words, the satellite transponder acts to receive a weak signal from the earth station, amplify the received weak signal and retransmit the amplified signal to the earth station.

The satellite transponder basically comprises an antenna part, a receiver part, a channel part and a transmitter part. The transmitter part includes a power amplifier which determines life of the satellite transponder. A channel amplifier is provided at the input of the power amplifier to drive the power amplifier at a proper operating point.

The channel amplifier is adapted to adjust the operating point of the power amplifier on the basis of a gain adjustment function. However, the adjustment of operating point through gain adjustment by channel amplified is not always preferable because it may shift the operating point fixed to a desired level in the case where an up-link fading is present.

In order to make up for the above-mentioned problem, the channel amplifier further comprises an automatic gain control function for maintaining an output level constant although an input power level is varied. Therefore, the output level of the channel amplifier is adjusted to a desired level in response to a telecommand signal from the earth control station. In this case, the operating point of the power amplifier is always fixed to an adjusted level, so that it can be prevented from being shifted. Here, an operating mode based on the gain adjustment function is called a fixed gain mode and an operating mode based on an automatic output level control function is called an automatic gain control mode. One of the fixed gain mode and the automatic gain control mode is selected by the telecommand signal from the earth control station.

Conventionally, an automatic gain controller is implemented using an analog control technique as shown in FIG. 1.

Referring to FIG. 1, there is shown a block diagram of a conventional analog automatic gain controller for satellite transponder. As shown in this drawing, the conventional analog automatic gain controller comprises a video amplifier 12 for amplifying a weak radio frequency (referred to hereinafter as RF) signal of an RF channel detected by a detector diode 11, which may be a model HP5082-2765 device, for example. The RF signal detected by the detector diode 11 has an output power within the range between −15 dBm (0.316 μW) and −2 dBm (6.310 μW). Provided that the video amplifier 12 has a gain of 50, it generates an output voltage which is 0.104 [V] when the output power of the RF signal detected by the detector diode 11 is −15 dBm and 2.082 [V] when −2 dBm.

The conventional analog automatic gain controller further comprises a logarithmic amplifier 13 for performing a logarithmic amplification function for correcting a characteristic of the detector diode 11 to convert it into a logarithmic characteristic. The logarithmic amplifier 13 may be a model AD759N device, for example. Because the logarithmic amplifier 13 has a transfer function of Vout=−log(Vin/0.1), it generates an output voltage which is −0.017 [V] when the output voltage from the video amplifier 12 is 0.104 [V] and −1.318 [V] when 2.082 [V].

The conventional analog automatic gain controller further comprises a linear amplification circuit 14 including a linear amplifier 15 and a loop filter (integrating filter) 16. The linear amplifier 15 has a gain of −1 for the use of an automatic gain control voltage of a positive level. A loop filter control voltage is applied to a positive voltage terminal of the loop filter 16 so that the automatic gain control voltage can be within the range between +0.017 [V] and +1.318 [V]. The loop filter 16 generates an output power which is fixed to −15 dBm when an output voltage from the linear amplifier 15 is +0.017 [V] and −2 dBm when +1.318 [V]. The conventional analog automatic gain controller further comprises an anti-logarithmic amplifier 22 for correcting an anti-logarithmic characteristic of a PIN diode (not shown) to convert it into a linear characteristic. The PIN diode may be a model HP5082-3340 device, for example. The anti-logarithmic amplifier 22 may be a model AD759N device, for example. Assuming that the loop filter 16 in the linear amplification circuit 14 generates an output voltage which is limited to the range between −2 [V] and +2 [V] by a zener diode (not shown) connected in parallel to an output terminal of the loop filter 16, the anti-logarithmic amplifier 22 generates an output voltage which is 10 [V] when the output voltage from the loop filter 16 is −2 [V], 0.1 [V] when 0 [V] and 0.001 [V] when 2 [V], because it has a transfer function of Vout=0.1*10^{−Vin}.

The conventional analog automatic gain controller further comprises a voltage/current converter 23 for converting the output voltage from the anti-logarithmic amplifier 22 into a current because a PIN diode attenuator 10 is a current drive type device. The voltage/current converter 23 may be a model AD694 device, for example. Because the voltage/current converter 23 has a transfer function of Iout=0.5 Vin[mA], it generates an output current which is 5 [mA] (20 dB attenuation) when the output voltage from the anti-logarithmic amplifier 22 is 10 [V] and 0.005 [mA] (0.5 dB attenuation) when 0.001 [V].

The conventional analog automatic gain controller further comprises a telecommand/telemetry processor 17 for adjusting the automatic gain control voltage in response to a telecommand signal from the earth control station, such as an automatic gain control mode on/off signal, a power level up/down signal or a reset signal. The telecommand/telemetry processor 17 includes a binary counter 18, a digital/analog (referred to hereinafter as D/A) converter 19 and a current/voltage converter 20. The binary counter 18 is operated upon receiving the telecommand signal from the earth control station. The D/A converter 19 converts output data from the binary counter 18 into an analog signal, which is then converted into a voltage signal by the current/voltage converter 20, being amplified by the gain of the linear amplification circuit 14. The voltage signal from the current/voltage converter 20 is applied as the loop filter control voltage to the positive voltage terminal of the loop filter 16 in the linear amplification circuit 14. Whenever the output data from the binary counter 18 is varied by one bit, the loop filter control voltage is adjusted in such a manner that the output power from the loop filter 16 can be varied by 1 dB. Namely, the adjustment of the loop filter control voltage results in a variation in a level of the automatic gain control voltage. In addition to the application to the D/A converter 19, the output data from the binary counter 18 based on the telecommand signal is also transmitted as a power level telemetry signal to the earth control station.

However, although the above-mentioned conventional automatic gain controller has been engineered for a long time and is somewhat advantageous in view of consumption power, it has a particular problem resulting from the analog technology. Namely, the conventional automatic gain controller is susceptible to a noise and unable to avoid a relative error introduced in the weak signal amplifying procedure. In order to overcome such a problem, a performance improvement has continuously been tried using more reliable individual devices and protecting circuit. However, such a try has a disadvantage in that it cannot solve a secondary parasitic effect which occurs upon a change in individual devices constituting an analog circuit or an addition of a separate circuit. Furthermore, a special environment such as space requires an automatic gain controller which is less susceptible to the noise and more reliably operable.

SUMMARY OF THE INVENTION

Therefore, the present invention has been made in view of the above problem, and it is an object of the present invention to provide a digital automatic gain controller for a satellite transponder which utilizes a reliable microprocessor to omit a plurality of weak signal processing steps and, nevertheless, has the same input/output characteristics as those of a conventional analog automatic gain controller and performs the same automatic gain control function as that of the conventional analog automatic gain controller.

In accordance with the present invention, the above and other objects can be accomplished by a provision of a digital automatic gain controller for a satellite transponder, comprising amplification means for amplifying a radio frequency signal detected by a detector diode by a difference between the detected radio frequency signal and a temperature compensation signal; control means for inputting an output signal from the amplification means and outputting the inputted signal as a telemetry signal to the earth control station, the control means adjusting an output level of a radio frequency channel in response to a telecommand signal from the earth control station based on the telemetry signal; and conversion means for converting an output data signal from the control means into a drive current for driving a PIN diode attenuator.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
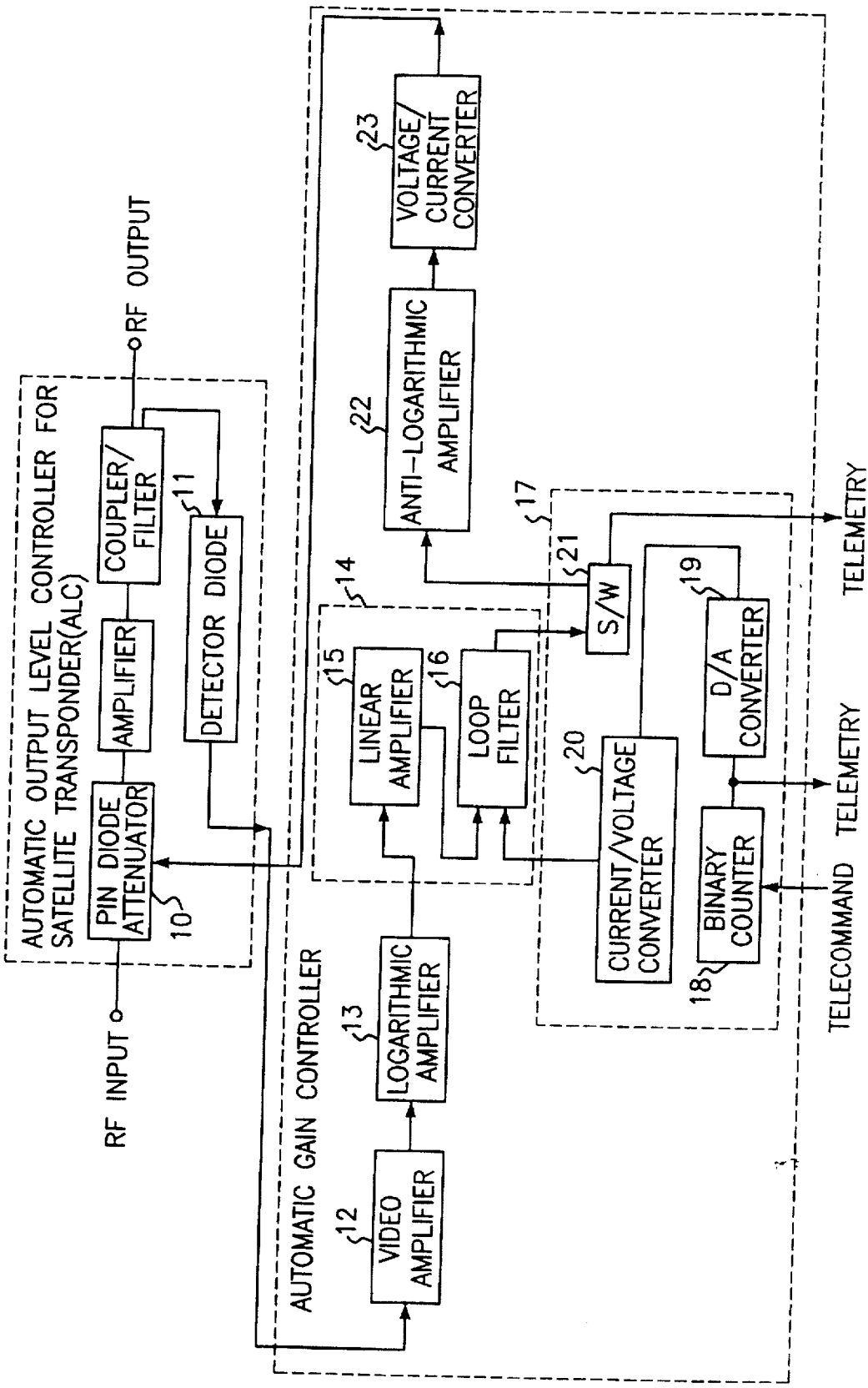
FIG. 1 is a block diagram of a conventional analog automatic gain controller for a satellite transponder.
Figure 2:
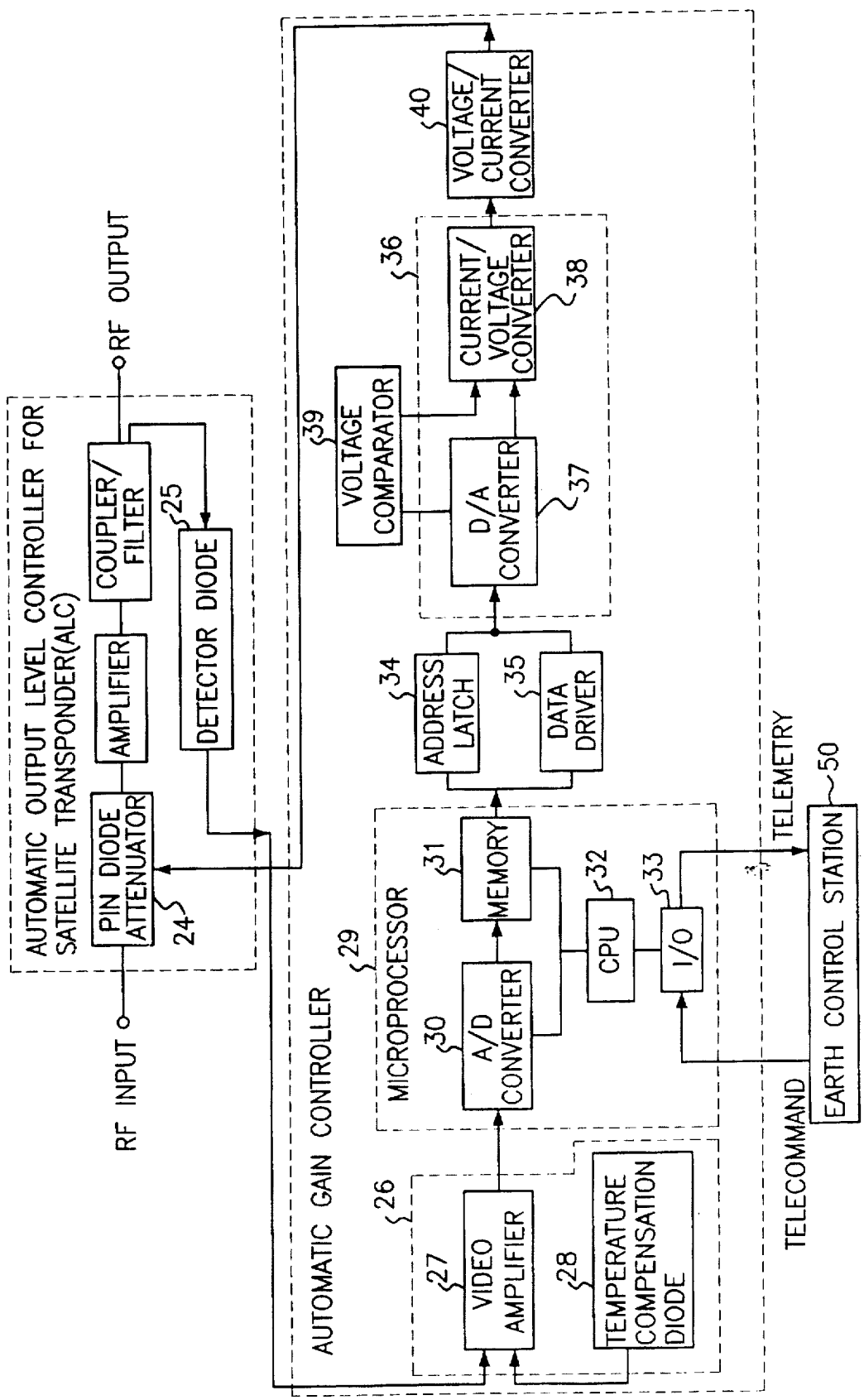
FIG. 2 is a block diagram of a digital automatic gain controller for a satellite transponder in accordance with the present invention.

Referring to FIG. 2, there is shown a block diagram of a digital automatic gain controller for a satellite transponder in accordance with the present invention. As shown in this drawing, the digital automatic gain controller comprises a video amplification circuit 26 for amplifying a weak RF signal of an RF channel detected by a detector diode 25. The RF signal detected by the detector diode 25 has an output power within the range between −15 dBm and −2 dBm. The video amplification circuit 26 includes a temperature compensation diode 28 for generating a temperature compensation signal, and a video amplifier 27 for amplifying the RF signal detected by the detector diode 25 by a difference between the detected RF signal and the temperature compensation signal from the temperature compensation diode 28. Provided that the video amplifier 27 has a gain of 50, it generates an output voltage which is 0.104 [V] when the output power of the RF signal detected by the detector diode 25 is −15 dBm and 2.082 [V] when −2 dBm.

The digital automatic gain controller further comprises a microprocessor 29 for inputting an output signal from the video amplification circuit 26 and outputting the input signal as a telemetry signal to the earth control station. Also, the microprocessor 29 is adapted to adjust an output level of the RF channel in response to a telecommand signal from the earth control station based on the telemetry signal. The telecommand signal from the earth control station may be an automatic gain control mode on/off signal, a power level up/down signal or a reset signal. The microprocessor 29 includes an analog/digital (referred to hereinafter as A/D) converter 30 for converting the output signal from the video amplification circuit 26 into a digital signal, and an input/output unit 33 for inputting the telecommand signal from the earth control station and outputting the digital signal from the A/D converter 30 as the telemetry signal to the earth control station. The earth control station analyzes the telemetry signal from the microprocessor 29 and recognizes the output level of the RF channel in accordance with the analyzed result. As a result of the output level recognition, the earth control station transmits the telecommand signal such as the power level up/down signal or the reset signal to the microprocessor 29 to increase, reduce or reset the output level of the RF channel. The microprocessor 29 also includes a memory 31 for outputting a data signal for adjustment of the output level of the RF channel in response to the telecommand signal from the earth control station based on the output signal from the A/D converter 30. Upon receiving the telecommand signal from the earth control station, the memory 31 outputs the data signal corresponding to the increase, reduction or resetting of the output level of the RF channel according to an input/output conversion table program stored therein. The microprocessor 29 performs a signal process based on input/output characteristics in a software program. In accordance with the preferred embodiment of the present invention, the microprocessor 29 may be an Intel 80C96 series central processing unit (CPU).

The digital automatic gain controller further comprises an address latch 34 for latching an address signal from the microprocessor 29, and a data driver 35 for transferring the data signal from the microprocessor 29 in response to an output signal from the address latch 34.

The digital automatic gain controller further comprises a conversion circuit 36 for converting the data signal from the microprocessor 29 transferred by the data driver 35 into a drive voltage for driving a PIN diode attenuator 24. The conversion circuit 36 includes a D/A converter 37 for converting the data signal from the microprocessor 29 into an analog signal. At this time, the D/A converter 37 generates an output current within the range between 2.1 [mA] and 4.2 [mA]. Namely, the output current from the D/A converter 37 has such a small value that it cannot drive the PIN diode attenuator 24. For this reason, a signal amplification operation must be performed with respect to the output current from the D/A converter 37. To this end, the conversion circuit 36 further includes a current/voltage converter 38 for converting the output current from the D/A converter 37 into an analog drive voltage for driving the PIN diode attenuator 24.

The PIN diode attenuator 24 is a current drive type device. For this reason, a voltage/current conversion operation must be performed with respect to the drive voltage from the current/voltage converter 38 in the conversion circuit 36. To this end, the digital automatic gain controller further comprises a voltage/current converter 40 for converting the drive voltage from the current/voltage converter 38 into a drive current for driving the PIN diode attenuator 24. In result, the PIN diode attenuator 24 is operated in response to the drive current from the voltage/current converter 40. In other words, the PIN diode attenuator 24 is operated in response to the data signal which is outputted from the microprocessor 29 on the basis of the telecommand signal from the earth control station such as the power level up/down signal or the reset signal and the input/output conversion table program stored in the memory 31.

As apparent from the above description, according to the present invention, the automatic gain controller for the satellite transponder is implemented in the digital processing using the microprocessor. Therefore, the digital automatic gain controller of the present invention has the effect of performing the automatic gain control operation flexibly and reliably on the basis of the program.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A digital automatic gain controller for a satellite transponder, comprising:

amplification means for amplifying a radio frequency signal detected by a detector diode of an output level controller by a difference between the detected radio frequency signal and a temperature compensation signal;

control means for inputting an output signal from said amplification means and outputting the inputted signal as a telemetry signal to an earth control station, said control means adjusting an output level of a radio frequency channel in response to a telecommand signal from said earth control station based on the telemetry signal; and conversion means for converting the adjusted output level of the radio frequency channel from said control means into a drive current for driving a PIN diode attenuator of the output level controller, wherein an output of the PIN diode attenuator is amplified and inputted into the detector diode through a filter.

2. A digital automatic gain controller for the satellite transponder, as set forth in claim 1, wherein said amplification means includes:

a temperature compensator for generating the temperature compensation signal; and a video amplifier for amplifying the radio frequency signal detected by said detector diode by the difference between the detected radio frequency signal and the temperature compensation signal from said temperature compensator.

3. A digital automatic gain controller for the satellite transponder, as set forth in claim 1, wherein said control means includes:

an analog/digital converter for converting the output signal from said amplification means into a digital signal and outputting the digital signal as the telemetry signal to said earth control station; and a memory for outputting a data signal for adjustment of the output level of the radio frequency channel in response to the telecommand signal from said earth control station based on the telemetry signal.

4. A digital automatic gain controller for the satellite transponder, as set forth in claim 3, wherein said control means is an Intel 80C96 series central processing unit.

5. A digital automatic gain controller for the satellite transponder, as set forth in claim 1, wherein said conversion means includes:

a digital/analog converter for converting the adjusted output level of the radio frequency channel from said control means into an analog signal;

a current/voltage converter for converting an output signal from said digital/analog converter into a voltage; and a voltage/current converter for converting an output voltage from said current/voltage converter into the drive current for driving said PIN diode attenuator.

6. A digital automatic gain controller for the satellite transponder, as set forth in claim 1, further comprising:

address latch means for latching an address signal from said control means; and data drive means for transferring the adjusted output level of the radio frequency channel from said control means to said conversion means in response to an output signal from said address latch means.

\* \* \* \* \*